US008557901B2

(12) United States Patent
Ozaki

(10) Patent No.: US 8,557,901 B2
(45) Date of Patent: Oct. 15, 2013

(54) POLYSILAZANE-CONTAINING COMPOSITION CAPABLE OF FORMING A DENSE SILICEOUS FILM

(75) Inventor: Yuki Ozaki, Shizuoka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 13/566,498

(22) Filed: Aug. 3, 2012

(65) Prior Publication Data

US 2012/0296022 A1 Nov. 22, 2012

Related U.S. Application Data

(63) Continuation of application No. 12/739,298, filed as application No. PCT/JP2008/069406 on Oct. 27, 2008, now Pat. No. 8,263,717.

(30) Foreign Application Priority Data

Oct. 26, 2007 (JP) ................................. 2007-279374

(51) Int. Cl.
*C08K 5/17* (2006.01)
*B05D 3/02* (2006.01)
*B05D 3/00* (2006.01)
*C09D 183/16* (2006.01)

(52) U.S. Cl.
USPC ............ 524/243; 524/252; 427/331; 427/387

(58) Field of Classification Search
None
See application file for complete search history.

(56) References Cited

U.S. PATENT DOCUMENTS

| 5,358,739 | A  | * | 10/1994 | Baney et al. ................... 427/226 |
| 5,747,623 | A  | * | 5/1998  | Matsuo et al. ..................... 528/14 |
| 5,885,654 | A  | * | 3/1999  | Hagiwara et al. ............. 427/226 |
| 5,914,151 | A  | * | 6/1999  | Usuki .............................. 427/128 |
| 5,922,411 | A  | * | 7/1999  | Shimizu et al. ............. 427/397.7 |
| 6,190,788 | B1 | * | 2/2001  | Shibuya et al. ................ 428/624 |
| 6,627,559 | B2 | * | 9/2003  | Shindo ............................ 438/780 |
| 7,053,005 | B2 | * | 5/2006  | Lee et al. ........................ 438/758 |
| 7,344,603 | B2 | * | 3/2008  | Shimizu et al. ................... 134/34 |
| 2003/0045635 | A1 | * | 3/2003 | Lukacs, III .................... 525/107 |
| 2005/0279255 | A1 | * | 12/2005 | Suzuki et al. ............. 106/287.11 |
| 2008/0107894 | A1 | * | 5/2008 | Brand et al. ................... 428/336 |

FOREIGN PATENT DOCUMENTS

JP 08176512 A * 7/1996
WO WO 2006056285 A1 * 6/2006

OTHER PUBLICATIONS

Machine-generated English-language translation of JP-08176512 to Nobe et al., 6 pages, translation generated Jul. 2011.*
Product Data Sheet for Eastman Methyl Isobutyl Ketone, 3 pages, Oct. 2008.*

* cited by examiner

*Primary Examiner* — Robert S Loewe
(74) *Attorney, Agent, or Firm* — Sangya Jain

(57) ABSTRACT

The present invention provides a polysilazane-containing composition capable of forming a dense siliceous film more rapidly and at a lower temperature than known polysilazane-containing composition. In a process for forming the siliceous film, the composition comprising a polysilazane compound, a particular amine compound and a solvent is coated on a substrate and converted into a siliceous substance. The particular amine compound preferably contains two amine groups separated from each other at the distance corresponding to five C—C bonds or more, and the amine groups preferably have hydrocarbon substituent groups.

14 Claims, No Drawings

POLYSILAZANE-CONTAINING COMPOSITION CAPABLE OF FORMING A DENSE SILICEOUS FILM

CROSS-REFERENCE TO RELATED APPLICATION

This application is a continuation application of Ser. No. 12/739,298, filed Apr. 22, 2010, which is related to International Patent Application No. PCT/JP2008/069406 filed Oct. 27, 2008, which is related to Japanese Patent Application No. 2007-279374 filed Oct. 26, 2007, the contents of which are hereby incorporated herein by reference.

TECHNICAL FIELD

This invention relates to a composition containing a polysilazane compound. In detail, the present invention relates to a polysilazane-containing composition which can form a dense siliceous film more rapidly and at a lower temperature than conventional compositions.

BACKGROUND ART

Polysilazane compounds can be generally converted into siliceous substances by heating, and the obtained siliceous substances have such excellent insulation properties that they are practically used as materials of insulating films in the electrical and electronic fields. However, if the polysilazane compounds are simply used, the conversion into the siliceous substances proceeds very slowly and needs high temperature. Since there is thus large room for improvement, various studies have been carried out to overcome the problems.

In order to improve the above problems, it is proposed to reform the polysilazane compounds themselves or to incorporate particular additives into polysilazane-containing compositions. For example, an N-heterocyclic compound (described in, for example, Patent document 1), an alkanol amine (described in, for example, Patent document 2) or an amine and/or acid (described in, for example, Patent document 3) is added as the additive into a polysilazane-containing composition so that the composition can form a siliceous film at a low temperature. The amine compounds described as the additives in the above documents are also used in a composition containing a diamine compound for other purposes such as reducing film-roughness or avoiding coating-ununiformity (described in, for example, Patent documents 4 and 5), and further they are still also used in a composition containing a polyamine compound for the purpose of hardening epoxy resin (described in, for example, Patent document 6).

A dense siliceous film can be obtained if the polysilazane-containing composition incorporating an N-heterocyclic compound additive, which is described in Patent document 1, is allowed to stand for 1 week under environmental conditions, preferably, is fired at 150° C. or more. However, it is desired to provide a polysilazane-containing composition which can favorably form a dense siliceous film more rapidly under environmental conditions or by firing at a lower temperature. Meanwhile, the N-heterocyclic compound is liable to have low solubility to a solvent. Accordingly, when added into the composition, the N-heterocyclic compound is generally dissolved in an organic solvent having high dissolution capacity, namely, in an aromatic hydrocarbon. However, since the aromatic hydrocarbon is generally very volatile and highly harmful to the human body, it is strongly required nowadays to reduce the amount in the solvent. In consideration of that, it is much desired to provide a polysilazane-containing composition which can form a siliceous film more rapidly and at a lower temperature and, at the same time, which contains a small amount of aromatic hydrocarbon solvent.

In contrast, various solvents are usable in the polysilazane-containing composition incorporating an amine and/or acid additive, which is described in Patent document 3. However, in order to form a dense siliceous film, it is necessary to bring the composition into contact with steam at a high temperature for a long time. This means that, in view of forming a dense siliceous film by low temperature firing under environmental conditions, there is still room for improvement.

Various solvents are also usable in the polysilazane-containing composition incorporating an alkanol amine, which is described in Patent document 2. Further, this composition can form a dense siliceous film by low temperature firing. For forming a dense siliceous film, the alkanol amine additive is made to react with the polysilazane compound, and thereby the polysilazane compound is reformed into a useful substance. However, since this reaction proceeds with violent heat generation and foaming, the alkanol amine must be diluted in a solvent and then added gradually for a long time. Accordingly, from the viewpoints of efficiency and cost in mass-production, there is room for improvement.

Patent documents 4 and 5 disclose a general formula representing a relatively wide scope of amine compounds. In the documents, it is described that coating ununiformity can be reduced by incorporating those amine compounds into a polysilazane-containing composition. On the other hand, however, the documents are silent about formation of a siliceous film obtained from the polysilazane-containing composition by low temperature firing. Further, the present inventors' study has revealed that any of the polysilazane-containing compositions disclosed in the documents, such as compositions incorporating hexamethylenediamine, p-phenylenediamine, and N,N,N',N'-tetramethylethylenediamine, cannot form a fully satisfying siliceous film by low temperature firing. Accordingly, it is found that there is still room for improvement.

[Patent document 1] Japanese Patent Laid-Open No. H11 (1999)-116815

[Patent document 2] Japanese Patent Laid-Open No. H11 (1999)-60736

[Patent document 3] Japanese Patent Laid-Open No. H9 (1997)-31333

[Patent document 4] Japanese Patent Laid-Open No. H8 (1996)-176511

[Patent document 5] Japanese Patent Laid-Open No. H8 (1996)-176512

[Patent document 6] Japanese Patent Laid-Open No. 2004-536196

[Patent document 7] Japanese Patent Publication No. S63 (1988)-16325

[Patent document 8] Japanese Patent Laid-Open No. S61 (1986)-89230

[Patent document 9] Japanese Patent Laid-Open No. S49 (1974)-69717

[Patent document 10] Japanese Patent Laid-Open No. H1 (1989)-138108

[Patent document 11] Japanese Patent Laid-Open No. H1 (1989)-138107

[Patent document 12] Japanese Patent Laid-Open No. H1 (1989)-203429

[Patent document 13] Japanese Patent Laid-Open No. H1 (1989)-203430

[Patent document 14] Japanese Patent Laid-Open No. H4 (1992)-63833

[Patent document 15] Japanese Patent Laid-Open No. H3 (1991)-320167

[Patent document 16] Japanese Patent Laid-Open No. H2 (1990)-175726

[Patent document 17] Japanese Patent Laid-Open No. H5 (1993)-86200

[Patent document 18] Japanese Patent Laid-Open No. H5 (1993)-331293

[Patent document 19] Japanese Patent Laid-Open No. H3 (1991)-31326

[Non-patent document 1] D. Seyferth et. al., Communication of Am. Cer. Soc., C-13, January 1983

[Non-patent document 2] D. Seyferth et. al., Polym. Prepr. Am. Chem. Soc., Div. Polym. Chem., 25, 10 (1984)

[Non-patent document 3] D. Seyferth et. al., Communication of Am. Cer. Soc., C-132, July 1984

DISCLOSURE OF INVENTION

Problem to be Solved by the Invention

In consideration of the aforementioned problems, it is an object of the present invention to provide a polysilazane-containing composition which can form a dense siliceous film more rapidly and at a lower temperature than conventional compositions.

Means for Solving Problem

The present invention is featured by
a polysilazane-containing composition comprising
a polysilazane compound,
an amine compound represented by the following formula (A):

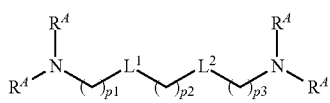

(A)

(wherein
each $R^A$ independently represents hydrogen or a hydrocarbon group of $C_1$ to $C_3$ under the condition that two $R^A$s connecting to the same nitrogen atom are not hydrogen atoms at the same time,
each of $L^1$ and $L^2$ independently represents —$CH_2$—, —$NR^{41}$— (in which $R^{41}$ is hydrogen or a hydrocarbon group of $C_1$ to $C_4$) or —O—,
each of p1 and p3 is independently an integer of 0 to 4, and p2 is an integer of 1 to 4),
or the following formula (B):

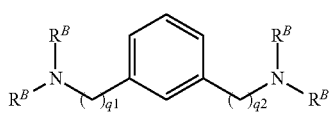

(B)

(wherein
each $R^B$ independently represents hydrogen or a hydrocarbon group of $C_1$ to $C_4$, and
each of q1 and q2 is independently an integer of 1 to 4), and
a solvent capable of dissolving said polysilazane compound and said amine compound.

The present invention is also featured by a process for forming a siliceous film, wherein the polysilazane-containing composition is coated on a substrate and then converted into a siliceous film.

The present invention is further featured by a siliceous film formed by the above process.

Effect of the Invention

The present invention makes it possible to form a dense siliceous film at a lower temperature than conventional compositions, for example, at room temperature. If heated, the composition of the present invention can rapidly form a dense siliceous film. Since the siliceous film can be formed at a low temperature such as room temperature, the cost of production facilities can be reduced and the facilities can be relatively freely designed. The siliceous film thus formed is so dense that it can be used in the same manner as conventional siliceous films. Further, the siliceous film formed from the polysilazane-containing composition of the present invention is significantly superior in hardness to siliceous films formed from conventional polysilazane-containing compositions, and therefore it is possible to further develop the use thereof.

In addition, since various solvents including solvents of low volatility are usable, the polysilazane-containing composition of the present invention is very favorable from the viewpoint of safety. Accordingly, the siliceous substance derived from the composition of the present invention is preferably used as a material of electronic parts such as an interlayer insulating film, a top-surface protective film and a primer for protective film. Further, in the field other than electronics, the siliceous substance derived from the composition of the present invention is also useful as a protective film of base materials such as metals, glass and plastics.

BEST MODE FOR CARRYING OUT THE INVENTION

Amine Compound

The polysilazane-containing composition according to the present invention comprises a particular amine compound. The particular amine compound used in the present invention is represented by the following formula (A):

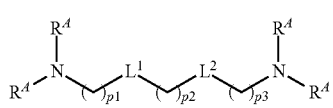

(A)

(wherein
each $R^A$ independently represents hydrogen or a hydrocarbon group of $C_1$ to $C_4$ under the condition that two $R^A$s connecting to the same nitrogen atom are not hydrogen atoms at the same time,
each of $L^1$ and $L^2$ independently represents —$CH_2$—, —$NR^{41}$— (in which $R^{41}$ is hydrogen or a hydrocarbon group of $C_1$ to $C_4$) or —O—,
each of p1 and p3 is independently an integer of 0 to 4, and p2 is an integer of 1 to 4), or the following formula (B):

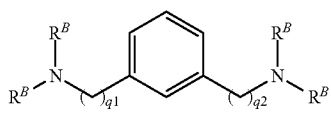

(B)

(wherein
each $R^B$ independently represents hydrogen or a hydrocarbon group of $C_1$ to $C_4$, and
each of q1 and q2 is independently an integer of 1 to 4). The amine compound contains two N atoms in a molecule, and they are separated from each other at the interval distance corresponding to almost five C—C bonds or more. If the amine compound contains more than two N atoms, any two of them satisfy the above condition. Further, the N atoms are preferably connected to short-chain hydrocarbon groups and the number of the hydrocarbon groups is preferably as large as possible. In other words, the number of N—H bonds is preferably as small as possible. However, with respect to the amine compound represented by the formula (B), the effect of the present invention can be obtained even if the terminal N atom is connected to two hydrogen atoms.

Among the above amine compounds, particularly preferred compounds are represented by the following formulas:

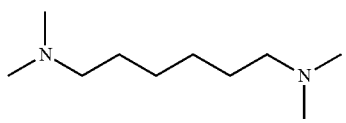
(A1)

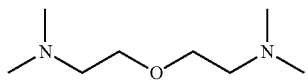
(A2)

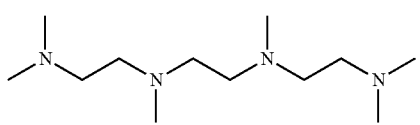
(A3)

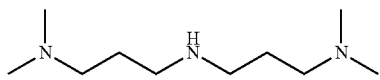
(A4)

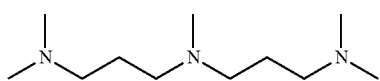
(A5)

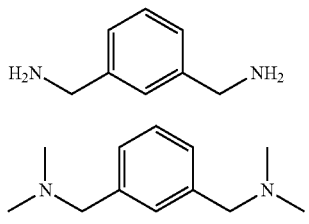
(B1)
(B2)

Those amine compounds can be used in combination of two or more, if necessary.

It is not clear how the particular amine compound defined in the present invention works to achieve the effect of the invention, but is presumed as follows. The amine compound defined in the present invention contains plural N atoms separated at proper distance, and hence can interact with plural Si atoms of the polysilazane compound simultaneously in the composition. As a result, the Si—N bonds in the polysilazane compound are thought to be easily cleaved to promote the silica conversion. Further, since the N atoms are connected to hydrocarbon groups, the solubility is improved and, at the same time, the electron donating ability is enhanced, so that the amine compound can readily interact with Si atoms of the polysilazane compound. In consideration of that, the hydrocarbon group connecting to the N atom preferably contains 3 or less carbon atoms. If having a long structure, the hydrocarbon group may be bulky enough to sterically hinder the interaction.

Polysilazane Compound

There is no particular restriction on the polysilazane compound used in the present invention, and any polysilazane compound can be selected to use unless it impairs the effect of the invention. It may be either an inorganic polysilazane compound or an organic one. Preferred examples of the inorganic polysilazane compound include: a perhydropolysilazane (described in Patent document 7) which contains a straight chain structure having a repeating unit represented by the following formula (I):

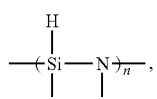

(I)

which has a molecular weight of 690 to 2000, which comprises 3 to 10 $SiH_3$ groups in a molecule, and in which the element ratios based on chemical analysis are Si: 59 to 61, N: 31 to 34 and H, 6.5 to 7.5 in terms of weight percent; and another perhydropolysilazane having a polystyrene-reduced average molecular weight of 3000 to 20000.

The above perhydropolysilazane can be synthesized according to the methods described in Patent document 7 and Non-patent document 1. The perhydropolysilazane basically comprises a chain moiety and a cyclic moiety, and can be represented by the formula:

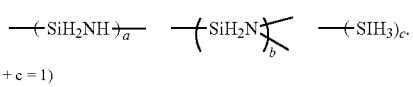

(a + b + c = 1)

The structure of perhydropolysilazane is, for example, as follows:

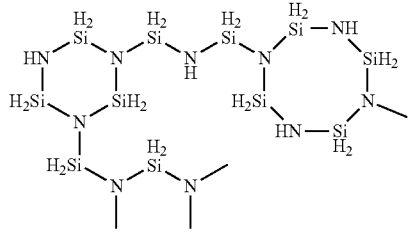

Other examples of the polysilazane compound include: a polysilazane which has a number average molecular weight of approx. 100 to 50000 and which has a skeleton comprising a structure unit represented by the following formula (II):

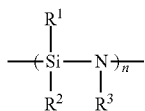
(II)

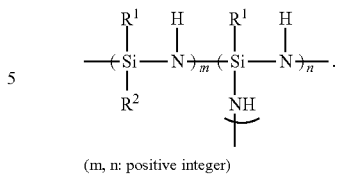
(II)

(m, n: positive integer)

(in which each of $R^1$, $R^2$ and $R^3$ is independently hydrogen, an alkyl group, an alkenyl group, a cycloalkyl group, an aryl group, an alkylsilyl group, an alkylamino group, an alkoxy group, or another group such as a fluoroalkyl group which contains a carbon atom directly connecting to the silicon atom, provided that at least one of $R^1$, $R^2$ and $R^3$ is hydrogen atom); and modified compounds thereof.

For example, a polysilazane represented by the formula (II) in which $R^1$ and $R^2$ are hydrogens and $R^3$ is methyl can be synthesized according to the method reported by Non-patent document 2. This method also provides a polysilazane of chain or cyclic polymer having a repeating unit —($SiH_2NCH_3$)—. There is no crosslinking structure in any polysilazane compound obtained by the method.

Further, a polyorgano(hydro)silazane represented by the formula (II) in which $R^1$ and $R^2$ are hydrogens and $R^3$ is an organic group can be synthesized according to the method reported by Non-patent document 2 or Patent document 8. This method also provides a polysilazane of a cyclic structure having a repeating unit —($R^2SiHNH$)— with a polymerization degree of 3 to 5 and a polysilazane which has both chain and cyclic structures in a molecule and which is represented by the formula:

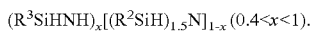
$(R^3SiHNH)_x[(R^2SiH)_{1.5}N]_{1-x} (0.4<x<1)$.

In addition, the above method also provides a polysilazane represented by the formula (II) in which $R^1$ is hydrogen and $R^2$ and $R^3$ are organic groups or in which $R^1$ and $R^2$ are organic groups and $R^3$ is hydrogen. That polysilazane may have a cyclic structure comprising a repeating unit —($R^1R^2SiNR^3$)— with a polymerization degree of 3 to 5.

Organic polysilazane compounds other than the compounds represented by the above formula (II) include: a polyorgano(hydro)silazane (described in Non-patent document 3) having a crosslinking structure represented by the formula:

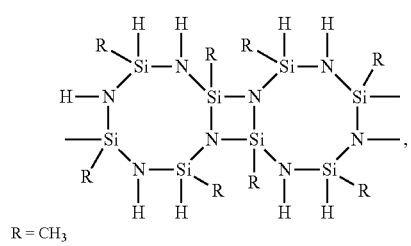
R = $CH_3$ a polysilazane $R^1Si(NH)_x$ having a crosslinking structure obtained by ammonolysis of $R^1SiX_3$ (X: halogen), and a polysilazane (described in Patent document 9) obtained by co-ammonolysis of $R^1SiX_3$ and $R^2_2SiX_2$ and represented by the following formula:

Examples of polysilazane compounds other than the above include: high polymers of inorganic silazane having increased molecular weights and/or having improved hydrolysis resistance, reformed polysilazanes (described in Patent documents 10 to 15), and co-polymerized silazanes (described in Patent documents 16 to 19) which are modified to be suitable for formation of thick films by introducing organic components into polysilazanes. These polysilazane compounds can be used in combination of two or more.

Solvent

The composition according to the present invention comprises a solvent capable of dissolving the above polysilazane compound and the above amine compound. There is no particular restriction on the solvent as long as it can dissolve the above components. Preferred examples of the solvent include:

(a) aromatic compounds, such as benzene, toluene, xylene, ethylbenzene, diethylbenzene, trimethylbenzene and triethylbenzene; (b) saturated hydrocarbon compounds, such as n-pentane, i-pentane, n-hexane, i-hexane, n-heptane, i-heptane, n-octane, i-octane, n-nonane, i-nonane, n-decane and i-decane; (c) alicyclic hydrocarbon compounds, such as ethylcyclohexane, methylcyclohexane, cyclohexane, cyclohexene, p-menthane, decahydronaphthalene, dipentene and limonene; (d) ethers, such as dipropyl ether, dibutyl ether, diethyl ether, methyl tertiary butyl ether (hereinafter, referred to as MTBE) and anisole; and (e) ketones, such as methyl isobutyl ketone (hereinafter, referred to as MIBK). Among them, more preferred are (b) saturated hydrocarbon compounds, (c) alicyclic hydrocarbon compounds, (d) ethers and (e) ketones.

Those solvents can be used in combination of two or more, so as to control the evaporation rate, to reduce the hazardousness to the human body and to control the solubility of the components.

It is also possible to use commercially available solvents as the solvent in the present invention. Examples of the usable commercially available solvents include: Pegasol AN45 ([trademark], manufactured by Exxon Mobil Corporation), which is an aliphatic/alicyclic hydrocarbon mixture containing an aromatic hydrocarbon of C8 or more in an amount of 5 to 25 wt %; and Exxsol D40 ([trademark], manufactured by Exxon Mobil Corporation), which is an aliphatic/alicyclic hydrocarbon mixture containing no aromatic hydrocarbon. If a mixture of solvents is used, it preferably contains an aromatic hydrocarbon in an amount of 30 wt % or less based on the total weight of the mixture, in view of reducing the hazardousness to the human body.

The amine compound defined in the present invention has relatively high solubility, and hence various solvents are usable. Accordingly, in consideration of safety, solvents of low volatility are preferably used. Particularly preferred are solvents of low volatility selected from the above-described examples, such as:

(b1) n-pentane, i-pentane, n-hexane, i-hexane, n-heptane, i-heptane, n-octane, i-octane, n-nonane, i-nonane, n-decane and i-decane;

(c1) ethylcyclohexane, methylcyclohexane, cyclohexane, cyclohexane, p-menthane and dipentene;

(d1) dipropyl ether, dibutyl ether and MTBE; and (e1) MIBK.

Further, Exxsol D40 ([trademark], manufactured by Exxon Mobil Corporation), which is described above, is also preferred.

As an indicator suggesting what solvent to select and use, vapor pressure of solvent can be adopted. Considering the relation between volatility and vapor pressure, solvent having a vapor pressure of 0.8 kPa or less at 20° C. are preferably used. The vapor pressure is more preferably 0.65 kPa or less, further preferably 0.5 kPa or less. Examples of those solvents include: dibutyl ether (vapor pressure at 20° C.: 0.48 kPa), Pegasol AN45 (vapor pressure at 20° C.: 0.29 kPa), Exxsol D40 (vapor pressure at 20° C.: 0.18 kPa), Certrex 60 (vapor pressure at 20° C.: 0.017 kPa), and Solvesso 150 (vapor pressure at 20° C.: 0.083 kPa). (Exxsol D40 and Solvesso 150, as well as Pegasol AN45 and Certrex 60, are trademarks manufactured by Exxon Mobil Corporation.) Those solvents are less volatile than, for example, xylene (vapor pressure at 20° C.: 0.87 kPa), and hence less harmful to the human body.

Other Additives

The composition according to the present invention can contain other additives, if necessary. Examples of the optional additives include a viscosity modifier and a crosslinking accelerator. Further, when used for a semiconductor devise, the composition can contain a phosphorus compound such as tris(trimethylsilyl)phosphate for the sake of Na-gettering effect.

Polysilazane-Containing Composition

The polysilazane-containing composition of the present invention comprises the above solvent in which the above polysilazane compound, the particular amine compound and other optional additives are dissolved or dispersed. There is no particular restriction on the order of dissolving or dispersing the components in the organic solvent. Further, the components may be beforehand reacted and then the solvent may be replaced.

The content of the amine compound is generally 50 wt % or less, preferably 10 wt % or less based on that of the polysilazane compound. Particularly in the case where the polysilazane compound is a perhydropolysilazane in which the silicon atom is not connected to an alkyl group or the like, the effect of the present invention can be obtained even if the amine compound is incorporated in a relatively small amount. This is because that perhydropolysilazane works advantageously from the electronic and stereochemical viewpoints. In that case, the composition preferably contains the amine compound in an amount of generally 1 to 20%, preferably 3 to 10%, more preferably 4 to 8%, further preferably 4 to 6%. The content of the amine compound is preferably more than a certain amount so that the amine compound can maximally perform its functions such as catalyzing the reaction and improving density of the film. On the other hand, however, it is preferably less than another certain amount so that the composition can keep compatibility and can form an uniform film.

The amount of each component described above depends on the use of the composition. However, in order to form a siliceous film having sufficient thickness, the content of the polysilazane compound is preferably 0.1 to 40 wt %, more preferably 0.5 to 20 wt %, and further preferably 5 to 20 wt %. Normally, if containing the polysilazane compound in an amount of 5 to 20 wt %, the composition can form a film of generally preferred thickness, for example, of a thickness of 2000 to 8000 Å.

Siliceous Film Formation Process

In the process of the present invention for forming a siliceous film, the above polysilazane-containing composition is coated on a substrate and then converted by heating, if necessary, into a siliceous film.

There is no particular restriction on what material the surface of the substrate is made of. The substrate may be a bare silicon wafer, or a silicon wafer coated with a thermal oxide film or with a silicon nitride film. If necessary, the substrate may be fabricated to form, for example, trench isolation grooves.

The composition can be coated on the substrate according to known methods, such as spin coating, dip coating, spraying method, and transferring method. Among them, spin coating is preferred.

After the composition is coated on the substrate, excess of the organic solvent is dried (removed), if necessary, and then the polysilazane compound in the composition is converted into a siliceous substance under an oxidizing atmosphere, such as an atmosphere containing steam, oxygen gas or mixture thereof. In the present invention, the conversion is preferably performed by firing under an atmosphere containing oxygen gas. The content of oxygen gas is preferably 1% or more, more preferably 10% or more by volume. The atmosphere may contain inert gases such as nitrogen and helium unless they impair the effect of the present invention.

If the conversion is performed under an atmosphere containing steam, the content of steam is preferably 0.1% or more, more preferably 1% or more by volume. In the present invention, the polysilazane compound is converted preferably by firing under an atmosphere containing both steam and oxygen gas.

It is necessary to perform the conversion at such a temperature that the polysilazane compound can be converted into a siliceous film. The temperature is generally 20 to 1000° C., preferably 20 to 300° C., more preferably 20 to 100° C. The conversion time can be properly determined according to the conversion temperature, but is normally 5 minutes to 1 week, preferably 15 minutes to 1 day, more preferably 15 minutes to 2 hours. Under a humid atmosphere, the temperature and time required for the conversion can be lowered and shortened, respectively. For example, if the conversion is carried out at a humidity of 70% or more, the temperature and time required for the conversion can be lowered to 80° C. or less and shortened to 1 hour or less, respectively.

Siliceous Film and Substrate Coated with Siliceous Film

A siliceous film and a substrate coated with the siliceous film can be produced from the aforementioned polysilazane-containing composition of the present invention. As long as the composition of the present invention is used, there is no particular restriction on the production conditions. For example, they can be obtained in the manner described above. The siliceous film and the siliceous film-coated substrate can be preferably used as electronic parts such as an interlayer insulating film, a top-surface protective film and a primer for protective film. Further, in the field other than electronics, they are also useful as protective films of surface of substrates such as made of metals, glass and plastics.

The present invention is further explained by use of the following examples.

SYNTHESIS EXAMPLE 1

Synthesis of Perhydropolysilazane

According to the method described in Patent document 1, a perhydropolysilazane was synthesized as follows.

A 1-L four-neck flask equipped with a gas-inlet tube, a mechanical stirrer and a Dewar condenser was used as a reaction vessel. The vessel was filled with a dry deoxidized nitrogen gas, and then 1500 ml of dry degassed pyridine was poured therein and cooled with ice. After that, 100 g of dichlorosilane was added to the vessel, to form white solid adduct ($SiH_2Cl_2 \cdot 2C_5H_5N$). While the reaction mixture was stirred and cooled with ice, 70 g of gaseous ammonia was bubbled therein. Subsequently, dry nitrogen gas was bubbled through the reaction liquid for 30 minutes to remove excess of the ammonia.

The formed product was subjected to reduced pressure filtration with a Buchner funnel under an atmosphere of dry nitrogen gas, to obtain 1200 ml of filtrate. From the filtrate, pyridine was distilled off by means of an evaporator to obtain 40 g of perhydropolysilazane. The number average molecular weight of the obtained perhydropolysilazane was measured by GPC (developer: $CDCl_3$), and thereby was found to be 800 in terms of polystyrene-standard. The IR spectrum thereof was also measured. As a result, absorption peaks assigned to N—H at 3350 and 1200 $cm^{-1}$, assigned to Si—H at 2170 $cm^{-1}$ and assigned to Si—N—Si at 1020 to 820 $cm^{-1}$ were verified.

EXAMPLES 1 TO 11 AND COMPARATIVE EXAMPLES 1 TO 7

In a 100 ml glass beaker, 16 g of the perhydropolysilazane obtained in Synthesis Example 1 and 64 g of dibutyl ether were mixed to prepare a polysilazane solution. While the polysilazane solution was stirred with a stirrer, 0.8 g (5.0 wt % based on the perhydropolysilazane) of tetramethylhexanediamine shown in Table 1 was added to obtain a polysilazane-containing composition of Example 1. The procedure of Example 1 was repeated except that the kind and amount of the amine compound and the solvent were changed into those shown in Table 1, to obtain polysilazane-containing compositions of Examples 1 to 11 and Comparative examples 1 to 7.

TABLE 1

| | Amine compound | | | |
|---|---|---|---|---|
| | Name | Structure | Amount | Solvent |
| Ex. 1 | tetramethyl-hexanediamine | (A1) | 5.0 | dibutyl ether |
| Ex. 2 | bis N,N-dimethylamino-ethyl ether | (A2) | 5.0 | dibutyl ether |
| Ex. 3 | 1,1,4,7,10,10-hexamethyltri-ethylene-tetramine | (A3) | 5.0 | dibutyl ether |
| Ex. 4 | m-xylenediamine | (B1) | 5.0 | dibutyl ether |
| Ex. 5 | iminobis N,N'-dimethyl-propylamine | (A4) | 5.0 | dibutyl ether |
| Ex. 6 | tetramethyl-hexanediamine | (A1) | 1.0 | dibutyl ether |
| Ex. 7 | tetramethyl-hexanediamine | (A1) | 3.0 | dibutyl ether |
| Ex. 8 | tetramethyl-hexanediamine | (A1) | 4.0 | dibutyl ether |
| Ex. 9 | tetramethyl-hexanediamine | (A1) | 8.0 | dibutyl ether |
| Ex. 10 | tetramethyl-hexanediamine | (A1) | 10.0 | dibutyl ether |
| Ex. 11 | tetramethyl-hexanediamine | (A1) | 20.0 | dibutyl ether |
| Ex. 12 | m-xylenediamine | (B1) | 5.0 | xylene |
| Com. Ex. 1 | trimethylenebis (N-methyl-piperidine) | $R^4$ is a hetero-ring in (A) | 5.0 | xylene |
| Com. Ex. 2 | dimethylhexyl-amine | only one N atom | 5.0 | dibutyl ether |
| Com. Ex. 3 | tetramethyl-ethylenediamine | $R^4$ = methyl, L1 = L2 = methylene, and p1 = p2 = p3 = 0 in (A) | 5.0 | dibutyl ether |
| Com. Ex. 4 | hexamethylene-diamine | All $R^4$s are hydrogen atoms in (A) | 5.0 | xylene |
| Com. Ex. 5 | tetrabutyl-hexanediamine | All $R^4$s are butyl groups in (A) | 5.0 | dibutyl ether |
| Com. Ex. 6 | m-phenylene-diamine | q1 = q2 = 0 in (B) | 5.0 | xylene/DMF* |
| Com. Ex. 7 | trimethylenebis (N-methyl-piperidine) | $R^4$ is a hetero-ring in (A) | 4.0 | xylene |
| Com. Ex. 8 | trimethylenebis (N-methyl-piperidine) | $R^4$ is a hetero-ring in (A) | 1.0 | dibutyl ether |
| Com. Ex. 9 | hexamethylene-diamine | All $R^4$s are hydrogen atoms in (A) | 1.0 | dibutyl ether |
| Com. Ex. 10 | m-phenylene-diamine | q1 = q2 = 0 in (B) | 1.0 | dibutyl ether |

*Because of the solubility of m-phenylenediamine, the solvent of Comparative Example 6 was a mixture of xylene 62 g/DMF 2 g.
**The amine compounds used in Comparative Examples 8, 9 and 10 had too poor solubility to prepare homogeneous compositions.

Among the above, homogeneous compositions were selected. Each homogeneous composition was spin-coated on a 4-inch silicon wafer of 0.5 mm thickness (under the conditions of 500 rpm/5 seconds and thereafter 1000 rpm/20 seconds). The compositions were then converted into siliceous substances under the following conditions.

Conversion condition A: settled for 24 hours under environmental conditions (room temperature, relative humidity: 40 to 55%);

Conversion condition A3: settled for 3 days under environmental conditions (room temperature, relative humidity: 40 to 55%);

Conversion condition B: subjected to high-temperature and high-humidity treatment for 60 minutes at 40° C. and a relative humidity of 95%;

Conversion condition C: fired for 2 hours on a hot-plate at 300° C.;

Conversion condition D: fired for 15 minutes on a hot-plate at 80° C. and then settled for 24 hours under environmental conditions (room temperature, relative humidity: 40 to 55%);

Conversion condition E: subjected to high-temperature and high-humidity treatment for 10 minutes at 40° C. and a relative humidity of 95%; and Conversion condition F: treated with steam heated at 200° C. for 1 hour.

Since the compositions of Comparative Examples 8 to 10 could not form uniform films, it was impossible to subject them to the following WER evaluation. Although very small amounts of amine compounds were added, they were insufficiently dissolved in the compositions of Comparative Examples 8 to 10. This means that solvents are restricted if amine compounds out of the scope of the present invention are used.

With respect to each composition, an IR spectrum was measure before and after the conversion so as to evaluate the degree of conversion into a siliceous substance. The IR spectrum of siliceous substance obtained by the conversion generally had absorption peaks assigned to Si—O bond approx. at 1030 cm$^{-1}$ and 450 cm$^{-1}$, assigned to Si—C bond approx. at 1270 cm$^{-1}$ and 780 cm$^{-1}$ and assigned to C—H bond approx. at 2970 cm$^{-1}$. On the other hand, the IR spectrum before the conversion generally had absorption peaks assigned to N—H bond approx. at 3350 cm$^{-1}$ and 1200 cm$^{-1}$ and assigned to Si—H bond at 2200 cm$^{-1}$. If the composition is converted into a siliceous substance, the former absorption peaks appear while the latter peaks disappear. Siliceous films formed from all the compositions of Examples 1 to 11 exhibited IR spectra in which the peaks characterizing polysilazane disappeared, and thereby it was verified that the compositions of the present invention were completely converted into siliceous substances. However, films formed from all the compositions of Comparative Examples exhibited IR spectra in which the peaks assigned to N—H bond were observed approx. at 3350 cm$^{-1}$ and 1200 cm$^{-1}$, and thereby it was found that they were not completely converted into siliceous substances.

The compositions were subjected to the WER evaluation in the following manner. Before and after the silicon wafer coated with each converted or unconverted composition was immersed in 0.5% aqueous hydrofluoric acid solution for 1 to 5 minutes, the thickness of the siliceous film was measured by means of an ellipsometer and thereby the thickness decreasing rate per minute (in terms of Å/minute) was calculated to determine a WER value. The results were as set forth in Tables 2 and 3. Small WER values in Tables mean that the siliceous films giving those values less undergo etching and accordingly have high density.

TABLE 2

| | WER (Å/min.) | |
|---|---|---|
| | Conversion condition A | Conversion condition B |
| Ex. 1 | 1027 | 712 |
| Ex. 2 | 960 | 832 |
| Ex. 3 | 4074 | 980 |
| Ex. 4 | 996 | 815 |
| Ex. 5 | 3471 | 2662 |
| Ex. 8 | 2522 | 807 |
| Com. Ex. 1 | 2403 | 1236 |
| Com. Ex. 2 | 6078 | 5765 |
| Com. Ex. 3 | 5723 | 6066 |
| Com. Ex. 4 | 7797 | 4417 |
| Com. Ex. 5 | 5421 | 4961 |
| Com. Ex. 6 | 5884 | 5739 |
| Com. Ex. 7 | 4204 | 2206 |
| Com. Ex. 8 | unmeasurable | |
| Com. Ex. 9 | unmeasurable | |
| Com. Ex. 10 | unmeasurable | |

TABLE 3

| | Conversion condition | WER (Å/min.) |
|---|---|---|
| Ex. 6 | C | 533 |
| Ex. 7 | B | 1256 |
| Ex. 8 | D | 1028 |
| Ex. 9 | E | 2337 |
| Ex. 10 | F | 299 |
| Ex. 11 | C | 388 |
| Com. Ex. 8 | unmeasurable | |

As for the silicon wafers coated with the films obtained under the conversion condition A3, the hardness thereof was measured by means of a nanoindenter hardness tester. The results were as set forth in Table 4.

TABLE 4

| | Hardness (Gpa) | Martens hardness (Gpa) | Young's modulus (Gpa) |
|---|---|---|---|
| Ex. 1 | 4.57 | 2.49 | 42.50 |
| Ex. 2 | 4.97 | 2.76 | 47.78 |
| Ex. 12 | 4.69 | 2.87 | 51.75 |
| Com. Ex. 1 | 3.65 | 1.92 | 36.46 |
| Com. Ex. 5 | 3.35 | 1.54 | 23.22 |

The invention claimed is:

1. A polysilazane-containing composition comprising
a polysilazane compound,
an amine compound represented by the following formula (A):

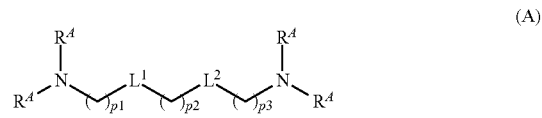

(wherein
each $R^A$ independently represents hydrogen or a hydrocarbon group of $C_1$ to $C_3$ under the condition that two $R^A$s connecting to the same nitrogen atom are not hydrogen atoms at the same time,
each of $L^1$ and $L^2$ independently represents, $CH_2$, —$NR^{A1}$— (in which $R^{A1}$ is hydrogen or a hydrocarbon group of $C_1$ to $C_4$) or —O—, where at least one of $L^1$ and $L^2$ is chosen from $CH_2$
each of p1 and p3 is independently an integer of 0 to 4, and p2 is an integer of 1 to 4),
and, a solvent capable of dissolving said polysilazane compound and said amine compound, where the solvent is selected from a ketone whose vapor pressure at 20° C. is 0.8 kPa or less.

2. The polysilazane-containing composition according to claim 1, wherein said solvent further comprises a second solvent selected from the group consisting of decane, p-menthane, dipentene, dibutylether and mixtures thereof.

3. The polysilazane-containing composition according to claim 2, wherein said second solvent is decane.

4. The polysilazane-containing composition according to claim 2, wherein said second solvent is p-menthane.

5. The polysilazane-containing composition according to claim 2, wherein said second solvent is dipentene.

6. The polysilazane-containing composition according to claim 2, wherein said second solvent is dibutylether.

7. The polysilazane-containing composition according to claim 1, wherein said solvent further comprise a second solvent selected from ethers.

8. The polysilazane-containing composition according to claim 1, wherein said solvent further comprise a second solvent selected from ethers whose vapor pressure at 20° C. is greater than 0.083 kPa.

9. The polysilazane-containing composition according to claim 1, wherein said solvent further comprise a second solvent selected from saturated hydrocarbon compounds.

10. The polysilazane-containing composition according to claim 1, wherein said solvent further comprise a second solvent selected from alicyclic hydrocarbon compounds.

11. The polysilazane-containing composition according to claim 1, wherein said polysilazane compound is perhydropolysilazane.

12. A process for forming a siliceous film, wherein the polysilazane-containing composition according to claim 1 is coated on a substrate and then converted into a siliceous film.

13. The process according to claim 12 for forming a siliceous film, wherein the conversion into a siliceous film is performed under the conditions of a temperature of 100° C. or below and a relative humidity of 40 to 95%.

14. A siliceous film formed by the process according to claim 12.

* * * * *